(12) United States Patent
Kitani et al.

(10) Patent No.: US 9,420,736 B2
(45) Date of Patent: Aug. 16, 2016

(54) COMPONENT SUPPLYING APPARATUS AND COMPONENT SUPPLYING METHOD

(71) Applicant: Panasonic Corporation, Osaka (JP)

(72) Inventors: Minoru Kitani, Osaka (JP); Kazunori Kanai, Yamanashi (JP); Kazuo Kido, Hyogo (JP); Seikou Abe, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 137 days.

(21) Appl. No.: 14/388,409

(22) PCT Filed: Sep. 3, 2013

(86) PCT No.: PCT/JP2013/005198
§ 371 (c)(1),
(2) Date: Sep. 26, 2014

(87) PCT Pub. No.: WO2014/125528
PCT Pub. Date: Aug. 21, 2014

(65) Prior Publication Data
US 2015/0053353 A1 Feb. 26, 2015

(30) Foreign Application Priority Data
Feb. 15, 2013 (JP) .................. 2013-027385

(51) Int. Cl.
*H05K 13/02* (2006.01)
*B32B 43/00* (2006.01)
*H05K 13/04* (2006.01)

(52) U.S. Cl.
CPC .............. *H05K 13/02* (2013.01); *B32B 43/006* (2013.01); *H05K 13/021* (2013.01); *H05K 13/0417* (2013.01); *H05K 13/0408* (2013.01); *Y10T 156/1195* (2015.01); *Y10T 156/1961* (2015.01)

(58) Field of Classification Search
CPC ............ H05K 13/021; H05K 13/0408; H05K 13/0417
See application file for complete search history.

(56) References Cited

U.S. PATENT DOCUMENTS 6,705,376 B2 * 3/2004 Van Der Rijst .... H05K 13/0417
156/701
7,850,040 B2 * 12/2010 Davis ..................... G07F 17/163
221/72

(Continued)

FOREIGN PATENT DOCUMENTS

| JP | 2010-507908 | 3/2010 |
|---|---|---|
| JP | 2011-086857 | 4/2011 |
| JP | 2011-211169 | 10/2011 |
| JP | 2012-164866 | 8/2012 |

(Continued)

OTHER PUBLICATIONS

International Preliminary Report on Patentability and Written Opinion of the International Searching Authority issued Aug. 27, 2015 in International (PCT) Application No. PCT/JP2013/005198 with English translation.

(Continued)

*Primary Examiner* — Mark A Osele
(74) *Attorney, Agent, or Firm* — Wenderoth, Lind & Ponack, L.L.P.

(57) ABSTRACT

A component supplying apparatus includes a main tape entering port, a component supply port through which components are picked up from a carrier tape, a main tape path extending in a body part from the main tape entering port to the underside of the component supply port, a top tape removing part removing the top tape from the carrier tape on the main tape path upstream of the component supply port, a sub tape entering port, a sub tape path meeting a slope path portion of the main tape path at a meeting point upstream of the top tape removing part, and at least one sprocket wheels engaging with the carrier tape on the main tape path downstream of the meeting point. A length of the sub tape path is shorter than a length of the main tape path from the main tape entering port to the meeting point.

5 Claims, 11 Drawing Sheets

(56) References Cited

U.S. PATENT DOCUMENTS

| | | |
|---|---|---|
| 9,055,709 B2 * | 6/2015 | Shin ................. B65H 37/002 |
| 9,137,936 B2 * | 9/2015 | Katsumi ............ H05K 13/0417 |
| 2008/0093375 A1 | 4/2008 | Davis et al. |
| 2011/0243695 A1 | 10/2011 | Hwang et al. |
| 2012/0305585 A1 | 12/2012 | Nagao et al. |
| 2015/0212519 A1 * | 7/2015 | Sumi ................. H05K 13/0417 700/115 |

FOREIGN PATENT DOCUMENTS

WO     2008/051669     5/2008

OTHER PUBLICATIONS

International Search Report issued Nov. 5, 2013 in International (PCT) Application No. PCT/JP2013/005198 with English translation.

* cited by examiner

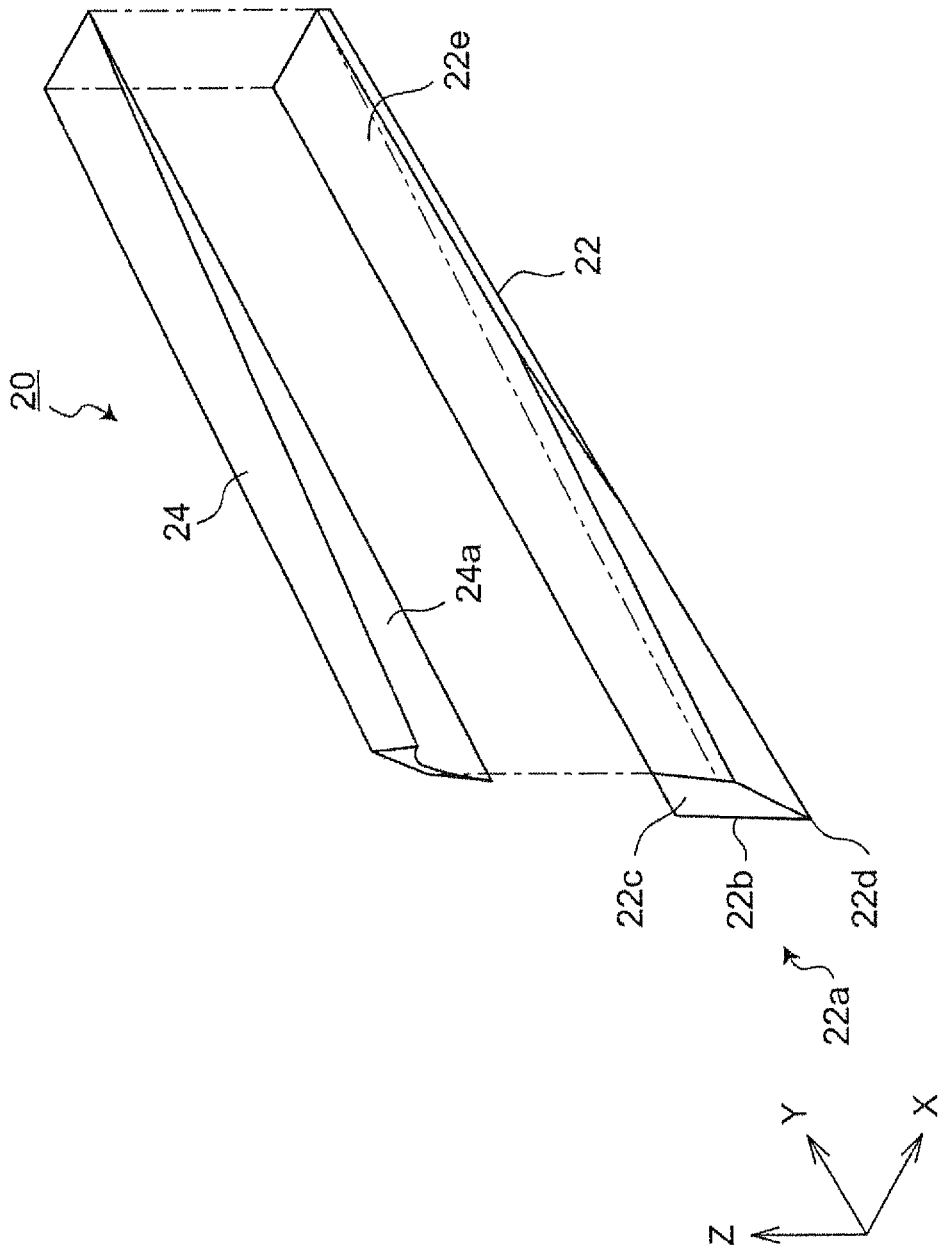

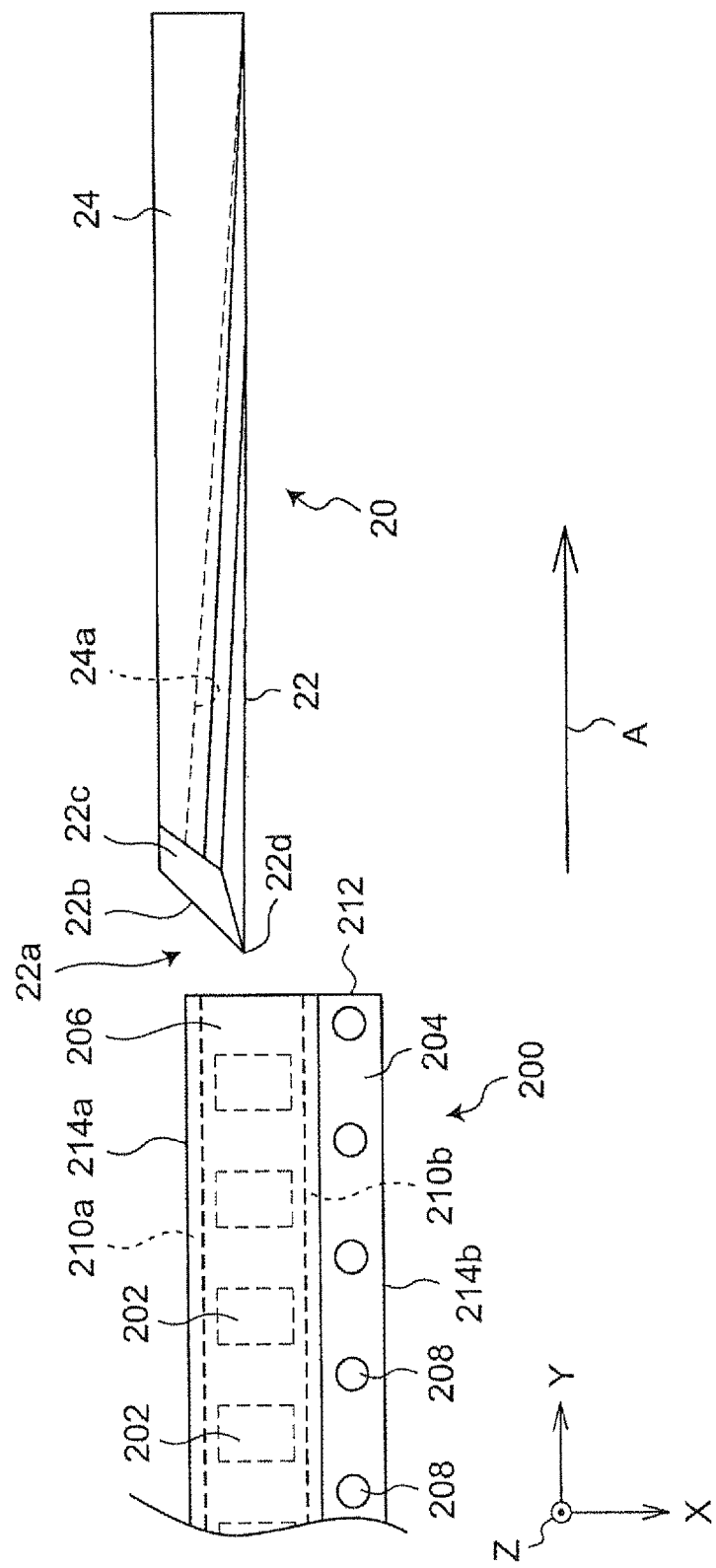

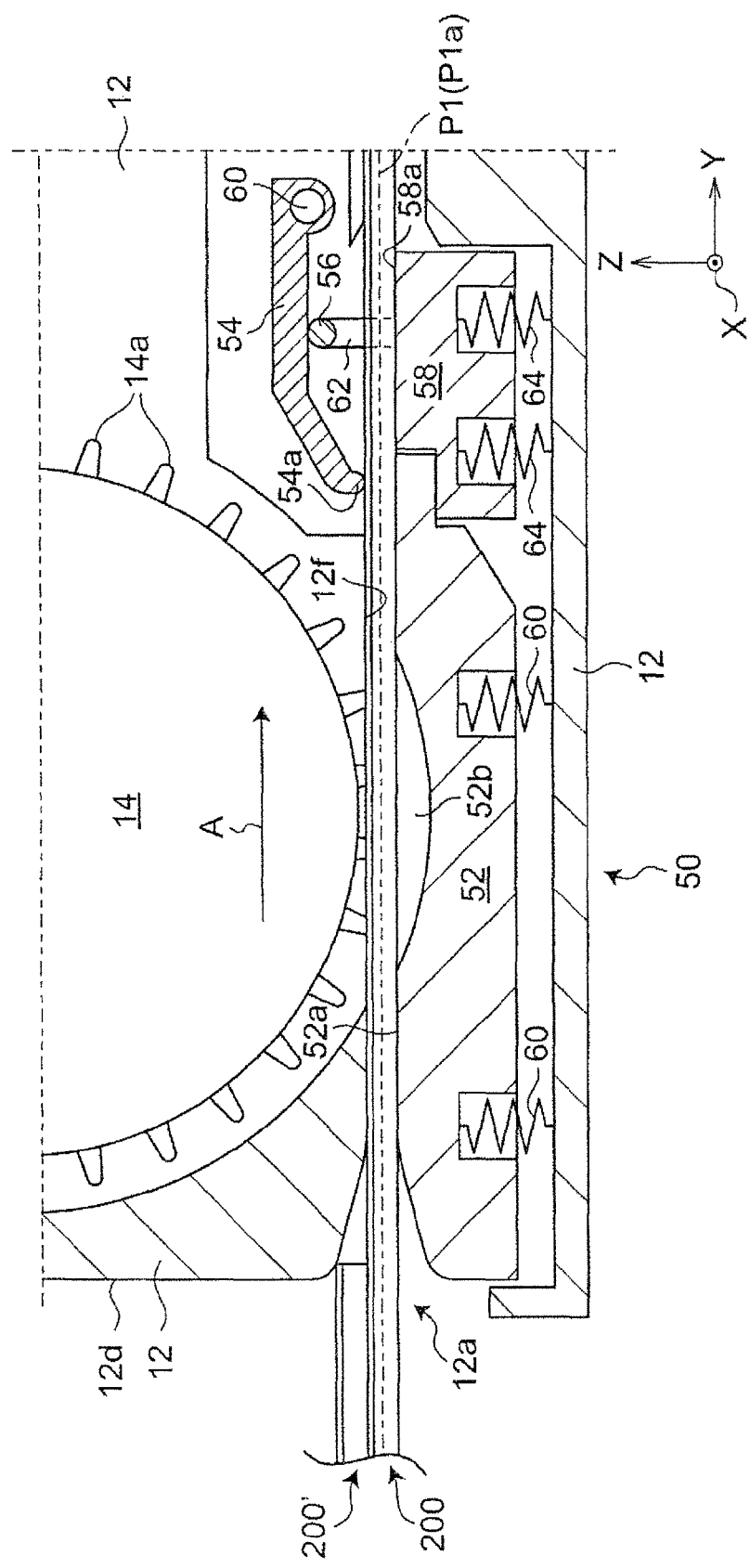

COMPONENT SUPPLYING APPARATUS AND COMPONENT SUPPLYING METHOD

TECHNICAL FIELD

The present invention relates to a component supplying apparatus and a component supplying method.

BACKGROUND ART

Conventionally, a carrier tape has been used for supplying components onto nozzles of a transfer head of a component mounting apparatus. The carrier tape includes a base tape in which a plurality of depressed or embossed recesses accommodating components are arranged in a tape length direction and a top tape which is pasted on the base tape so as to cover the plurality of recesses having the components accommodated therein. The carrier tape is fed in the tape length direction, and the top tape is continuously removed from the base tape of the moving carrier tape so that the components in the recesses of the carrier tape can be serially sucked by the nozzles of the transfer head of the component mounting apparatus.

For example, in a component supplying apparatus disclosed in Patent Document 1, the carrier tape is entered into a body part of the component supplying apparatus in a tape length direction through a tape entering port, and then fed along a tape path placed in the body part toward the underside of a component supply port. Specifically, a sprocket wheel engages with feed holes of the carrier tape at a position near the component supply port and then rotates, consequently the carrier tape is fed from the tape entering port to the component supply port. The nozzles of the transfer head pick up components from the carrier tape in the body part through the component supply port.

The component supplying apparatus disclosed in Patent Document 1 also includes a top tape removing part positioned on the upstream side in a tape feeding direction of and near the component supply port. The top tape removing part have an edge for removing the top tape from the base tape of the carrier tape moving in the tape length direction. The top tape removing part also is located on the tape path in the body part. The edge of the top tape removing part enters from the front end side of the moving carrier tape into between the top tape and the base tape in the tape length direction, consequently the top tape is continuously removed from the base tape.

CITATION LIST

Patent Document

Patent Document 1:
Japanese Laid-Open Publication No. 2012-164866

SUMMARY OF INVENTION

Problems to be Solved by the Invention

For example, when a few trial products on which components of a carrier tape are mounted are made by a component mounting apparatus, when operation checks of a component supplying apparatus and a component mounting apparatus are carried out, or when a carrier tape offered by a carrier tape supplier is tested, user sometime wants to provisionally use a relatively short carrier tape having any length (irregular length, for instance) as substitute for a relatively long carrier tape having a regular length, which is wound around a reel for instance.

As the component supplying apparatus disclosed in Patent Document 1, many a component supplying apparatus, which the carrier tape moves in a body part thereof, are based on the premise that the relatively long carrier tape having the regular length and, for example, wound around the reel is used. Usually, such component supplying apparatus do not have a versatile capacity to use both the relatively long carrier tape having the regular length and the relatively short carrier tape having any length. Consequently, it is possible that the component supplying apparatus cannot use the relatively short carrier tape, depending on the length thereof.

In order to use the relatively short carrier tape having any length, it is possible to arrange a number of sprocket wheels on the tape path of the carrier tape extending in the component supplying apparatus with it spaced at a narrowest possible pitch distance. However, due to the number of sprocket wheels and a drive device for rotating the sprocket wheels synchronously, the component supplying apparatus becomes a larger size and a more complex.

It is an object of the invention to make it possible to supply nozzles of a transfer head of a component mounting apparatus with component from both relatively long carrier tape having a regular length and, for example, wound around a reel and relatively short carrier tape having any length, without sizing up and complexing a component supplying apparatus.

Means to Solve the Problems

In order to achieve the object, the invention is configured as follows.

According to a first aspect of present invention, there is provided a component supplying apparatus for feeding in a tape length direction a carrier tape having a base tape having recesses for accommodating components and feed holes arranged thereon in the tape length direction and a top tape pasted on the base tape so as to cover the recesses, the component supplying apparatus comprising:

a body part, a main tape entering port formed on the body part, a component supply port which formed on an upper surface of the body part and through which nozzles of a transfer head of a component mounting apparatus pick up the components in the recesses of the carrier tape having been entered in the body part, a main tape path extending in the body part from the main tape entering port to the underside of the component supply port, a top tape removing part removing the top tape from the base tape of the carrier tape on the main tape path upstream in the tape feeding direction of the component supply port so as to expose the components in the recesses, a sub tape entering port formed on the body part and different from the main tape entering port, a sub tape path extending in the body port from the sub tape entering port and meeting the main tape path at a meeting point in the main tape path located upstream in the tape feeding direction of the top tape removing part, and at least one first sprocket wheel engaging with the feed holes of the carrier tape on the main tape path downstream in the tape feeding direction of the meeting point and feeding the carrier tape in the tape feeding direction, wherein the main tape path includes a horizontal path portion passing under the component supply port in a horizontal direction and a slope path portion extending in an obliquely upward direction toward the horizontal path portion, wherein the sub tape path extends in an obliquely downward direction and meets the slope path portion of the main tape path, and wherein a length of the sub tape path is shorter than a length of the main tape path from the main tape entering port to the meeting point.

According to a second aspect, there is provided the component supplying apparatus of the first aspect further comprising a second sprocket wheel engaging with the feed holes of the carrier tape on the main tape path between the main tape entering port and the meeting point and feeding the carrier tape in the tape feeding direction, wherein the length of the sub tape path is shorter than a length of the main tape path from the second sprocket wheel to the meeting point.

According to a third aspect, there is provided the component supplying apparatus of the first or second aspect, wherein the main tape entering port has a size enough for two carrier tape overlapping each other in the thickness direction to enter in, further comprising an automatic feeding device, until a rear end in the tape feeding direction of one of two carrier tapes having been entered into the main tape entering port and overlapped each other passes beyond a front end in the tape feeding direction of the other, keep the other carrier tape waiting in the main tape path between the main tape entering port and the meeting point.

According to a fourth aspect, there is provided the component supplying apparatus of any one of from the first aspect to the third aspect, wherein the first sprocket wheel engages with the feed holes of the carrier tape on the main tape path between the top tape removing part and the meeting point.

According to an fifth aspect, there is provided a component supplying method for feeding in a tape length direction a carrier tape having a base tape having recesses accommodating components and feed holes respectively arranged thereon in the tape length direction and a top tape pasted on the base tape so as to cover the recesses, the component supplying method comprising:

entering the carrier tape into a body part of a component supplying apparatus through a main tape entering port, feeding the carrier tape having been entered in to the body part in the tape feeding direction along a main tape path which extending in the body part from the main tape entering port to the underside of a component supply port and which including a horizontal path portion passing under the component supply port in a horizontal direction and a slope path portion extending in an obliquely upward direction toward the horizontal path portion, removing the top tape from the base tape of the carrier tape on the main tape path upstream in the tape feeding direction of the component supply port so as to expose the components in the recesses, and picking up the components in the recesses of the carrier tape with the top tape removed through the component supply port by using nozzles of a transfer head of a component mounting apparatus, further comprising, in case that the carrier tape has a length shorter than the distance in the main tape path from main tape entering port to the component supply port, feeding the shorter carrier tape in the tape feeding direction toward the component supply port along a sub tape path which extends in the body part in an obliquely downward direction from a sub tape entering port different from the main tape entering port and which meets the main tape path at a meeting point on the slope path portion of the main tape path located upstream in the tape feeding direction of the top tape removing part, by using at least one sprocket wheel engaging with the feed holes of the carrier tape on the main tape path downstream in the tape feeding direction of the meeting point, wherein a length of the sub tape path from the sub tape entering port to the meeting point is shorter than a length of the main tape path from the main tape entering port to the meeting point.

Effects of Invention

According to the invention, it is possible to supply nozzles of a transfer head of a component mounting apparatus with component from both relatively long carrier tape having a regular length and, for example, wound around a reel and relatively short carrier tape having any length, without sizing up and complexing a component supplying apparatus.

BRIEF DESCRIPTION OF DRAWINGS

The above aspects and features of the present invention will become more apparent from the following description of preferred embodiments thereof with reference to the accompanying drawings, and wherein:

FIG. 3A is an exploded perspective view of a top tape removing device;

FIG. 5B shows schematically the configuration of the automatic feeding device before a subsequent carrier tape is entered;

EMBODIMENTS FOR CARRYING OUT THE INVENTION

Hereinbelow, an embodiment of the invention will be described with reference to the drawings.

Figure 1:
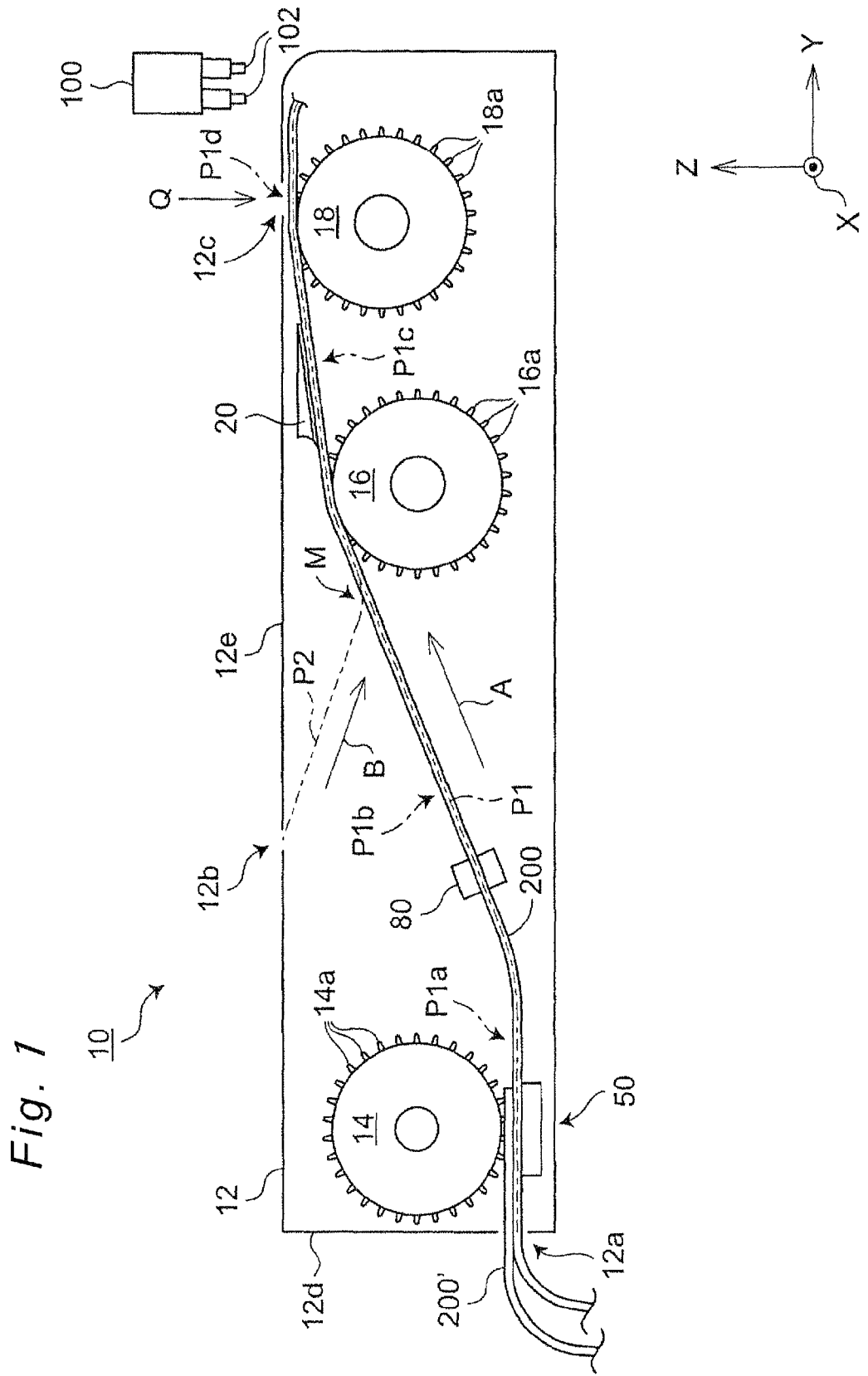
FIG. 1 shows schematically a configuration of a component supplying apparatus in accordance with an embodiment of the invention.

FIG. 1 schematically shows a configuration of a component supplying apparatus in accordance with the embodiment. The component supplying apparatus 10 is configured so as to supply components onto nozzles 102 of a transfer head 100 of a component mounting apparatus. Specifically, the component supplying apparatus 10 is configured to serially fed a carrier tape 200, which accommodating the components with it arranged in a tape length direction, toward a component supply position Q in the tape length direction. and thus supply the nozzles 102 of the transfer head 100 with the components at the component supply position Q.

Figure 2:
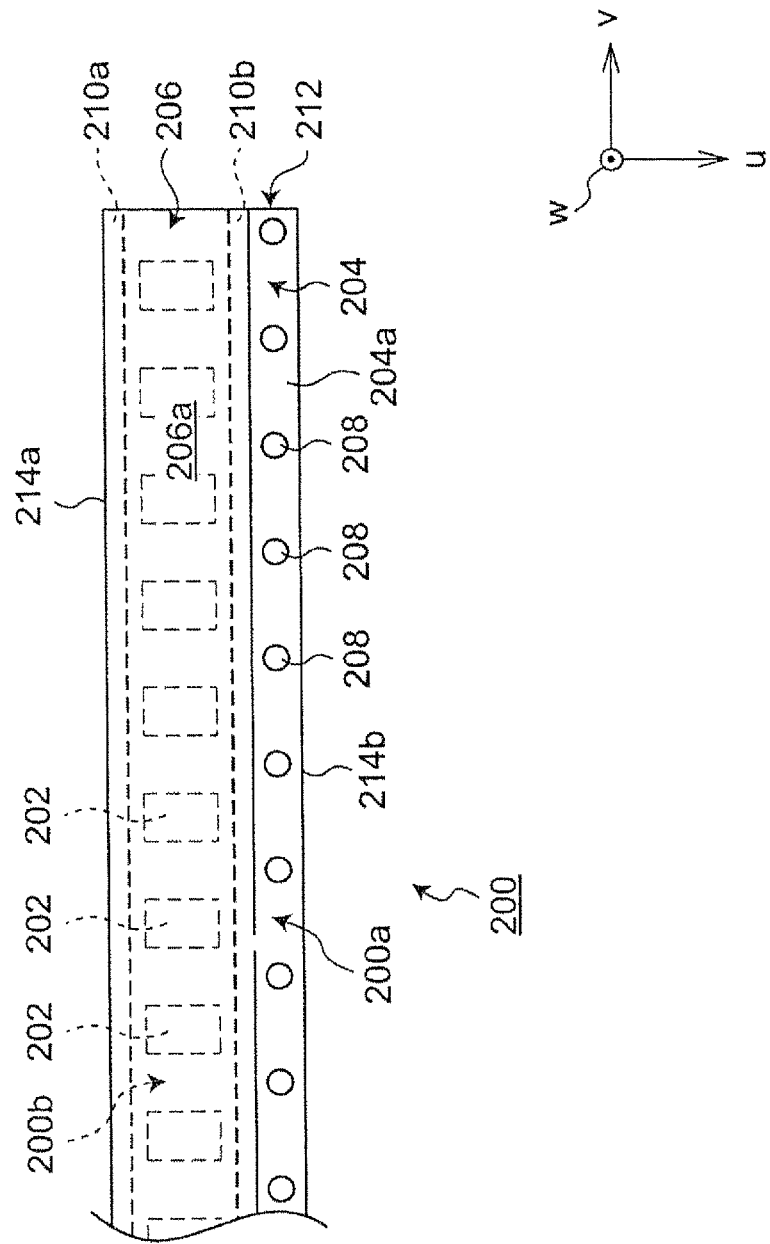
FIG. 2 is a view of a front end of a carrier tape.

FIG. 2 shows a front end portion (end portion that resides on front side when the carrier tape 200 is moving in a tape feeding direction A which is a direction toward the component supply position Q) of the carrier tape 200. In a rectangular coordinate system u-v-w shown in FIG. 2, u-axis direction corresponds to tape width direction, v-axis direction corresponds to tape length direction, and w-axis direction corresponds to tape thickness direction.

As shown in FIG. 2, the carrier tape 200 has a base tape 204 having a plurality of recesses 202 accommodating the components, which supplied onto the nozzles 102 of the transfer head 100 of the component mounting apparatus, and arranged in the tape length direction (v-axis direction), and a top tape 206 pasted on the base tape 204 through both end sides thereof in the tape width direction (u-axis direction) so that the top tape 206 covers the recesses 202. The carrier tape 200 has a plurality of feed holes 208 formed on the base tape 204, arranged in the tape length direction, and penetrates in the tape thickness direction (w-axis direction).

As shown in FIG. 2, the top tape 206 is pasted with adhesives 210a, 210b or the like on a portion of a main surface 204a of the base tape 204 excluding a portion thereof where the feed holes 208 are formed. Specifically, both end portions of the top tape 206 excluding center portion (portion covering the recesses 202) in the tape width direction (u-axis direction) are pasted on the main surface 204a of the base tape 204 with adhesive 210a, 210b or the like.

Returning to FIG. 1, the component supplying apparatus 10 has a body part 12, a main and sub tape entering port 12a, 12b through which the carrier tape 200 is entered into the body part 12, and a component supply port 12c through which the nozzles 102 of the transfer head 100 pick up components from the carrier tape 200 having been entered into the body part 12.

The main tape entering port 12a is formed on a side surface 12d (end surface in Y-axis direction) of the body part 12 which is a side surface far from the component supply position Q in a horizontal direction (Y-axis direction). The sub tape entering port 12b and the component supply port 12c are formed on an upper surface 12e (end surface in a vertical direction (Z-axis direction)) of the body part 12. In the embodiment, as shown in FIG. 1, the sub tape entering port 12b and the component supply port 12c are formed on the common upper surface 12e and thus located at the same level (same position in Z-axis direction), but not be limited thereto. The sub tape entering port 12b and the component supply port 12c may be located at a different level.

The body part 12 of the component supplying apparatus 10 also includes main tape path P1 and sub tape path P2 for guiding the carrier tape 200 to the underside of the component supply port 12c. The main tape path P1 extends from the main tape entering port 12a to the underside of the component supply port 12c in the body part 12.

Specifically, the main tape path P1 includes a first horizontal path portion P1a extending from the main tape entering port 12a in the horizontal direction (Y-axis direction), a first slope path portion P1b extending from the first horizontal path portion P1a in an obliquely upward direction, a second slope path portion P1c extending from the first slope path portion P1b in an obliquely upward direction at a slope angle smaller than that of the first slope path portion P1b, and a second horizontal path portion P1d extending from the second slope path portion P1c in the horizontal direction and passing under the component supply port 12c. The first and second slope path portions P1b, P1c however may slope at same angle, instead of the different angle.

The carrier tape 200, which have been entered into the body part 12 through the main tape entering port 12a, is fed toward the underside of the component supply port 12c and thus passes through the first horizontal path portion P1a, the first slope path portion P1b, the second slope path portion P1c, and the second horizontal path portion P1d of the main tape path P1 in this order.

The sub tape path P2 extends from the sub tape entering port 12b into the body part 12 and meets the main tape path P1. Specifically, the sub tape path P2 extends from the sub tape entering port 12b in an obliquely downward direction and meets the first slope path portion P1b of the main tape path P1.

The carrier tape 200, which have been entered into the body part 12 through the sub tape entering port 12b, is fed along the sub tape path P2 toward a meeting point M at which the sub tape path P2 meets the first slope path portion P1b of the main tape path P1. The carrier tape 200, which have passed through the meeting point M, is fed toward the underside of the component supply port 12c and thus passes through the first slope path portion P1b, the second slope path portion P1c, and the second horizontal path portion P1d of the main tape path P1 in this order.

The sub tape path P2 meets the first slope path portion P1b of the main tape path P1 at an angle enabling the carrier tape 200, which have been entered into the body part 12 through the sub tape entering port 12b and then passed through the meeting point M, to certainly go into the component supply port 12c-side of the main tape path P1 without going into the main tape entering port 12a-side thereof. That is, the sub tape path P2 meets the first slope path portion P1b of the main tape path P1 so that a moving direction A of the carrier tape 200 on the first slope path portion P1b of the main tape path P1 and a moving direction B of carrier tape 200 on the sub tape path P2 are intersect one another at an acute angle.

The length of the sub tape path P2 (distance from the sub tape entering port 12b to the meeting point M) is shorter than the length in the main tape path P1 from the main tape entering port 12a to the meeting point M. As just described, there are a plurality of paths for the carrier tape 200 toward the underside of the component supply port 12c as the main tape path P1 and the sub tape path P2. The reasons will hereinafter be described.

The component supplying apparatus 10 also includes sprocket wheels 14, 16, and 18 feeding the carrier tape 200 toward the underside of the component supply port 12c in the tape feeding direction A, and a top tape removing device 20 (top tape removing part) continuously removing the top tape 206 from the base tape 204 of the moving carrier tape 200.

The plurality of sprocket wheels 14, 16, and 18 are provided on the main tape path P1 and have teeth 14a, 16a, and 18a engaging with the feed holes 208 of the carrier tape 200. The sprocket wheels 14, 16, and 18 rotate with teeth 14a, 16a, and 18a engaging with the feed holes 208 of the carrier tape 200 and thereby feed the carrier tape 200 in the tape feeding direction A.

The sprocket wheel 14 is disposed upstream in the tape feeding direction A with respect to the meeting point M of first slope path portion P1b of the main tape path P1 and the sub tape path P2, and on the first horizontal path portion P1a of the main tape path P1.

The sprocket wheel 16 is disposed upstream in the tape feeding direction A with respect to the meeting point M and at a connection point between the first and second slope path portions P1b, P1c of the main tape path P1.

The sprocket wheel 18 is disposed at a connection point between the second slope path portion P1c and the second horizontal path portion P1d. The sprocket wheel 18 also is disposed upstream in the tape feeding direction A with respect to the component supply position Q and near it. Specifically, the sprocket wheel 18 is disposed so that the teeth 18a engage with feed holes 208 adjacent to the recess 202 of the carrier tape 200 in the tape width direction, which accommodates the component exposed to outside of the body part 12 through the component supply port 12c.

The top tape removing device 20 removes the top tape 206 from the base tape 204 of the carrier tape 200 and thus exposes the component accommodated in the recess 202. Consequently, the nozzles 102 of the transfer head 100 can pick up the component accommodated in the recess 202 of the carrier tape 200 through the component supply port 12c at the component supply position Q.

The top tape removing device 20 also is disposed upstream in the tape feeding direction A with respect to the component supply position Q and above the second slope path portion P1c of the main tape path P1 between two sprocket wheels 16, 18. The top tape removing device 20 further is configured to partially remove the top tape 206 from the base tape 204 of the carrier tape 200 being fed by the sprocket wheels 16, 18, in particular, to continuously remove the one side portion in the tape width direction of the top tape 206 from the base tape 204.

Figure 3B:
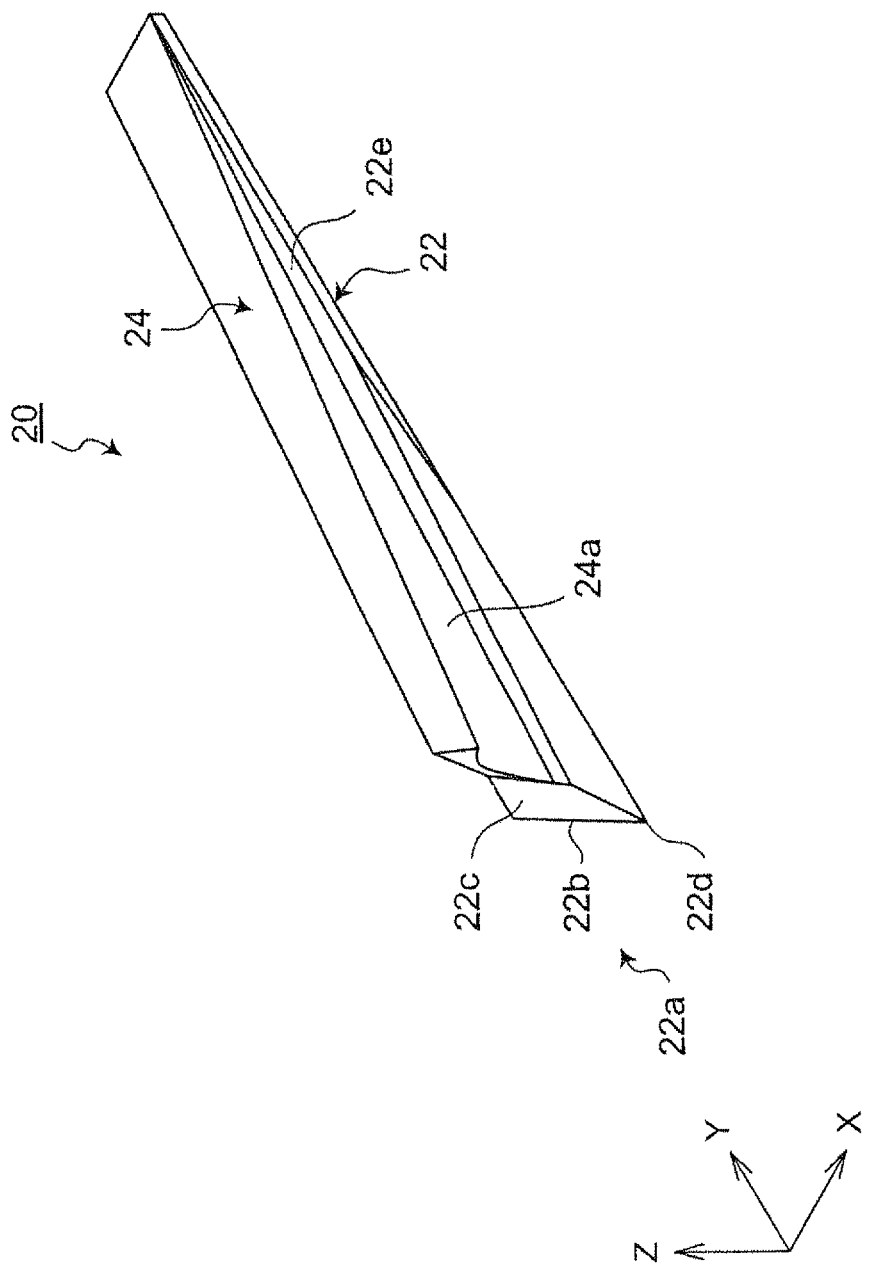
FIG. 3B is a perspective view of the top tape removing device.
Figure 4:
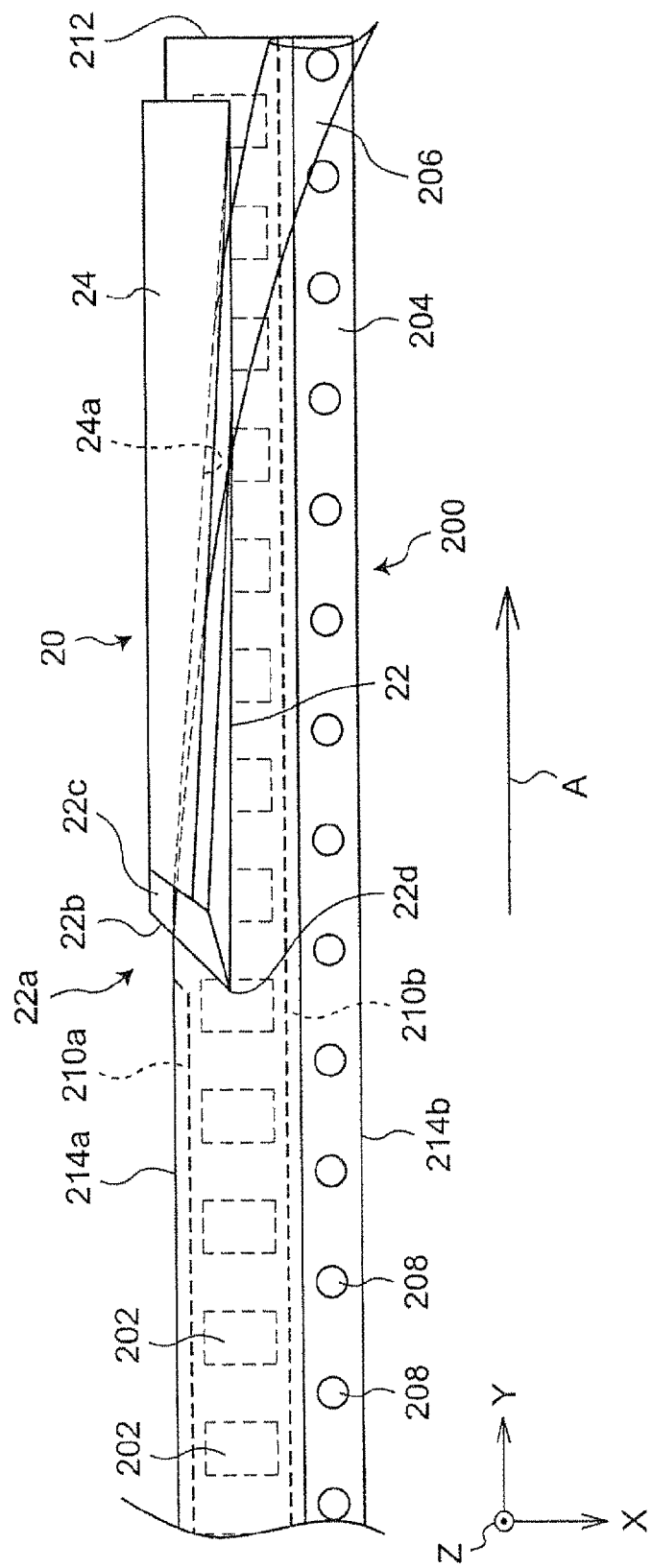
FIG. 4A is a top view of the top tape removing device right before the starting a partially and continuously removing of the top tape.
FIG. 4B is top view of the top tape removing device during the partially and continuously removing of the top tape.

FIG. 3A is an exploded perspective view of the top tape removing device 20. FIG. 3B is a perspective view of the top tape removing device 20. FIG. 4A is a top view of the top tape removing device 20 right before partially removing the top tape 206 from the base tape 204 of the carrier tape 200 fed in the tape feeding direction A. FIG. 4B is a top view of the top tape removing device 20 partially removing the top tape 206 from the base tape 204 of the carrier tape 200 fed in the tape feeding direction A.

As shown in FIGS. 3A, 3B, the top tape removing device 20 includes a removal part 22 (removal member) partially removing the top tape 206 from the base tape 204 of the carrier tape 200, and a folding part 24 (folding member) folding the portion of the top tape 206 having been partially removed by the removal part 22 toward the feed hole 208-side as shown in FIG. 4B.

The removal part 22 of the top tape removing device 20 is made from a metal strip and has a blade portion 22a for removing the top tape 206 from the base tape 204. The blade portion 22a has a blade edge 22b removing the top tape 206 from the base tape 204, a scooping surface 22c for guiding and scooping the removed portion of the top tape 206 away from the base tape 204, and an edge tip 22d for entering between the top tape 206 and the base tape 204.

The folding part 24 of the top tape removing device 20 is mounted on an upper surface 22e of the removal part 22. The folding part 24 also has a conical concave surface 24a for guiding the portion of the top tape 206 removed by the removal part 22 so that the removed portion of the top tape 206 is folded toward the feed hole 208b-side of the carrier tape 200. The conical concave surface 24a extends from the upper surface 22e of the removal part 22 and overhang it due to the concave curving.

As shown in FIG. 4A, the top tape removing device 20 is provided in the body part 12 of the component supplying apparatus 10 so that the edge tip 22d of the removal part 22 enters into a un-pasted portion between the top tape 206 and the base tape 204 (i.e., portion between the adhesives 210a, 210b located on both side in the tape width direction). The conical concave surface 24a of the folding part 24 opens on the feed hole 208-side of the carrier tape 200.

The carrier tape 200 is fed in the tape feeding direction A toward the component supply position Q by the sprocket wheels 16, 18. Consequently, the edge tip 22d of the removal part 22 of the top tape removing device 20 enters from the front end 212-side of the carrier tape 200 in the tape feeding direction A into between the top tape 206 and the base tape 204.

The carrier tape 200, of which the edge tip 22d of the removal part 22 of the top tape removing device 20 has entered into between the top tape 206 and the base tape 204, is further fed. Consequently, the blade edge 22b of the removal part 22 starts to partially remove a portion of the top tape 206 (one side portion in the tape width direction) from the base tape 204.

Specifically, the blade edge 22b of the removal part 22 starts to continuously remove a portion of the top tape 206 on the side of the side face 214a of the carrier tape 200 further from the feed holes 208 in the tape width direction. The portion of the top tape 206 on the side face 214a-side removed by the blade edge 22b is guided by the scooping surface 22c and thus proceeds to the concave surface 24a of the folding part 24.

The carrier tape 200 is further fed in the tape feeding direction A toward the component supply position Q, and consequently the portion of the top tape 206 on the side face 214-side removed by the blade edge 22b is folded toward the feed hole 208-side (side face 214b) by the conical concave surface 24a of the folding part 24.

According to the top tape removing device 20, the top tape 206 is partially removed from the base tape 204 so that the components accommodated in the recesses 202 of the carrier tape 200 are serially exposed. The carrier tape 200 can be fed in such a state toward the component supply position Q. Consequently, the nozzles 102 of the transfer head 100 of the component mounting apparatus can serially suck and pick up the components accommodated in recesses 202 of the base tape 204 at the component supply position Q.

As shown in FIG. 1, the component supplying apparatus 10 further includes an automatic feeding device 50 for serially and automatically feeding a plurality of the carrier tapes 200 in the tape feeding direction A toward the sprocket wheel 16 on the component supply position Q-side.

The automatic feeding device 50, as shown in FIG. 1, is provided in the first horizontal path portion P1a of the main tape path P1 and configured to serially and automatically feed the plurality of the carrier tapes 200 one by one along the main tape path P1 in the tape feeding direction A. Specifically, the automatic feeding device 50 is configured to serially and automatically feed the carrier tapes 200 in the tape feeding direction A so that a front end in the tape feeding direction A of a subsequent carrier tape, which proceeds to supply the nozzles 102 of the transfer head 100 of the component mounting apparatus with the components, runs after a rear end in the tape feeding direction A of a preceding carrier tape, which just supplying the nozzles 102 of the transfer head 100 with the components.

Figure 5A:
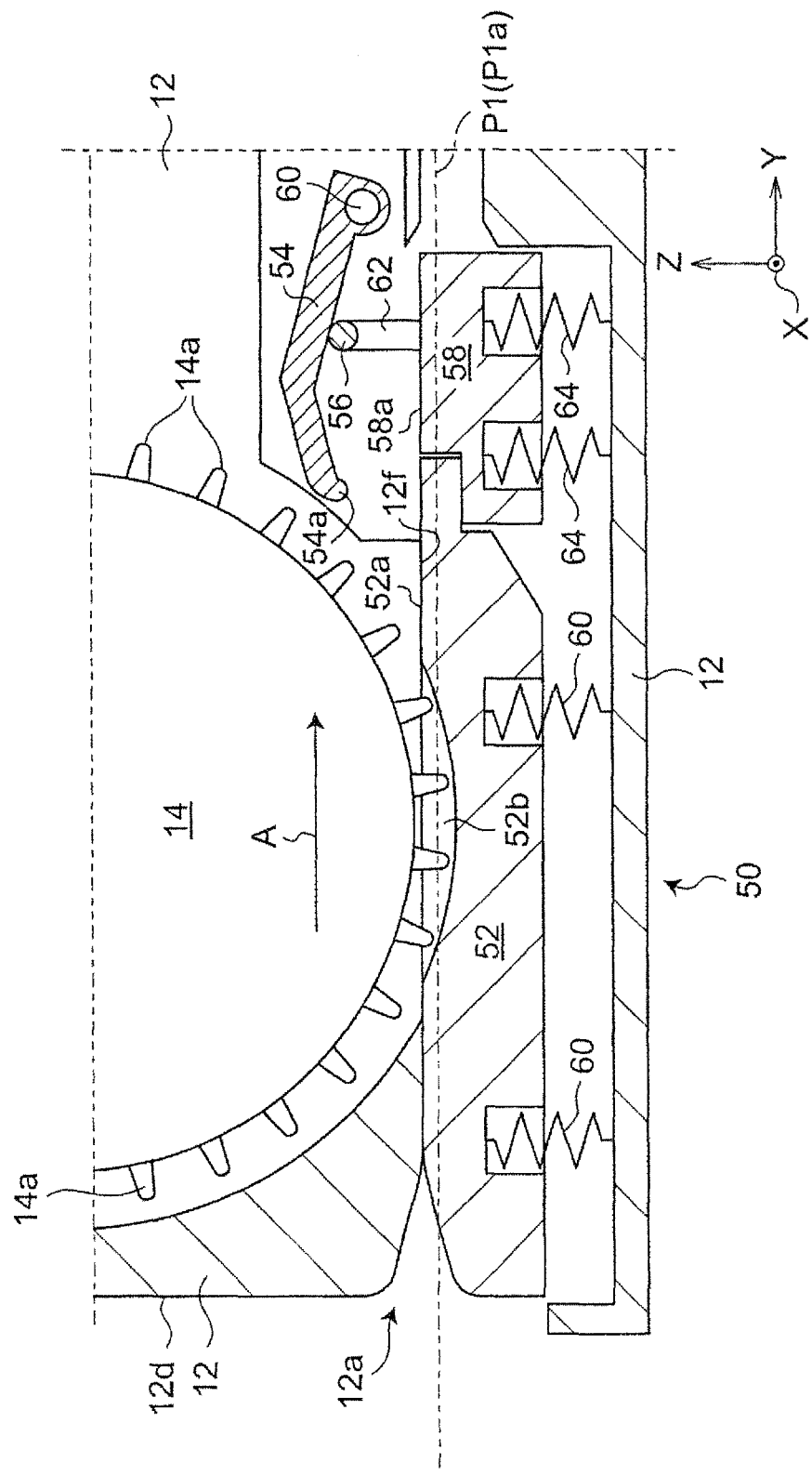
FIG. 5A shows schematically a configuration of an automatic feeding device before a preceding carrier tape is entered.

The automatic feeding device 50 includes, as shown in FIG. 5A, the sprocket wheel 14 provided in the first horizontal path portion P1a of the main tape path P1, a biasing block 52 biasing the carrier tape 200 toward the sprocket wheel 14, a swing lever 54 keeping the subsequent carrier tape 200, which proceeds to be fed toward the sprocket wheel 16 on the component supply position Q-side, waiting, a drive bar 56 driving the swing lever 54, and elevating block 58 on which the drive bar 56 is provided. The elements in the automatic feeding device 50 are described in detail with reference to FIGS. 5A-5D showing operations of the automatic feeding device 50.

FIG. 5A shows the body part 12 before the carrier tape 200 is entered in the main tape entering port 12a.

As shown in FIG. 5A, the body part 12 of the component supplying apparatus 10 includes a guide surface 12f for guiding the carrier tape 200 which has been entered into the main tape entering part 12a. The guide surface 12f of the body part 12 is an inner wall surface of the body part 12 parallel to X-Y plane and contacts with the top tape-side surface 200a (main surface) of the carrier tape 200. It is to be noted that the sprocket wheel 14 is located on the face side of the drawing with respect to the guide surface 12f (i.e., the feed holes 208 are located on the face side of the drawing).

The biasing block 52, as shown in FIG. 5A, is provided in the body part 12 with it being movable in Z-axis direction. The biasing block 52 also has a guide surface 52a facing to the guide surface 12f of the body part 12 and the sprocket wheel 14 in Z-axis direction and contacting with a back surface 200b of the carrier tape 200. Further, the biasing block 52 is biased by a spring 60 toward the guide surface 12f of the body part 12 and the sprocket wheel 14 in Z-axis direction. However, on the guide surface 52a of the biasing block 52, a groove 52b is formed so as to accommodate the teeth 14a of the sprocket wheel 14 when there is no carrier tape 200 between the guide surface 12f and the biasing block 52 (when the guide surface 52a of the biasing block 52 comes into contact with the guide surface 12f of the body part 12).

The carrier tape 200 having been entered into the main tape entering port 12a, as shown in FIG. 5B, for example, is manually pushed by worker in the tape feeding direction A into between the guide surface 12f of the body part 12 and the guide surface 52a of the biasing block 52, and thereby is caught between the guide surface 12f of the body part 12 and the guide surface 52a of the biasing block 52 in the tape thickness direction (Z-axis direction). That is, the biasing block 52 is biased in a direction away from the guide surface 12f by the carrier tape 200.

The sprocket wheel 14 is configured to freely rotate so that the teeth 14a of the sprocket wheel 14 can engage with the feed holes 208 of the carrier tape 200 when the carrier tape 200 is pushed in the tape feeding direction A into between the guide surface 12f of the body part 12 and the guide surface 52a of the biasing block 52. Preferably, the sprocket wheel 14 may rotate only in the rotational direction (counterclockwise direction in drawing) corresponding to the tape feeding direction A so as to prevent the carrier tape 200 with the feed holes 208 engaging with the teeth 14a of the sprocket wheel 14 from moving in the opposite direction.

The carrier tape 200 with the feed holes 208 engaging with the teeth 14a of the sprocket wheel 14 is manually pushed in the tape feeding direction A toward the back of the body part 12 by worker, thereby beyond between the biasing block 52 and the sprocket wheel 14 and thus toward the sprocket wheel 16 located downstream of the sprocket wheel 14 in the tape feeding direction A. Consequently, the feed holes 208 of the carrier tape 200 engage with the teeth 16a of the sprocket wheel 16 (See, FIG. 1).

The sprocket wheel 16 is rotated by a drive source such as a motor (not shown) with the teeth 16 engaging with the feed holes 208 of the carrier tape 200. Consequently, the carrier tape 200 with the feed holes 208 engaging with the teeth 16a of the sprocket wheel 16 is fed in the tape feeding direction A, the top tape 206 thereof are partially and continuously removed by the top tape removing device 20, and then the feed holes 208 thereof engage with the teeth 18a of the sprocket wheel 18 located downstream of the sprocket wheel 16 in the tape feeding direction A. Thus, the carrier tape 200 with the top tape 206 having been removed so as to expose the components in the recesses 202 is fed in the tape feeding direction A toward the component supply position Q by the sprocket wheels 16, 18.

During that the preceding carrier tape 200 having been previously entered into the body part 12 through the main tape entering port 12a is fed in the tape feeding direction A toward the component supply position Q by the sprocket wheels 16, 18, the next (subsequent) carrier tape 200 is entered into the main tape entering port 12a by worker, as shown in FIG. 5B. Hereinafter, apostrophes are added to the reference numbers related to the subsequent carrier tape.

Specifically, as shown in FIG. 5B, the subsequent carrier tape 200' is entered into the main tape entering port 12a so that the subsequent carrier tape 200' is stacked on the preceding carrier tape 200 in the tape thickness direction (Z-axis direction).

Figure 5C:
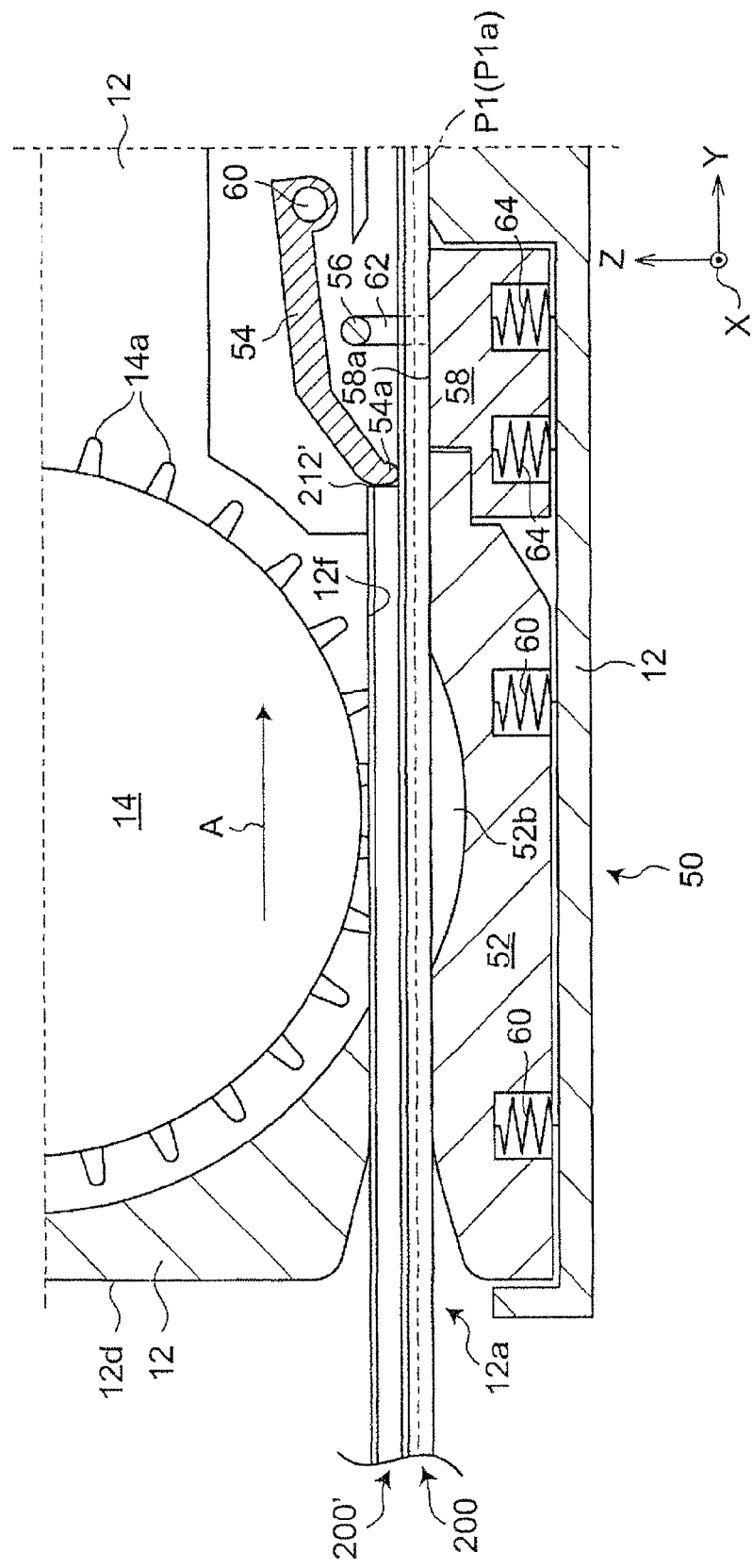
FIG. 5C shows schematically the configuration of the automatic feeding device with the subsequent carrier tape waiting and the preceding carrier tape fed toward a component supply position.

As shown in FIG. 5B, the subsequent carrier tape 200', which have been entered into the main tape entering port 12a and thus have stacked on the preceding carrier tape 200, is pushed in the tape feeding direction A toward the back of the body part 12, and thereby is arranged between the guide surface 12f of the body port 12 and the guide surface 52a of the biasing block 52 with it stacking on the preceding carrier tape 200 as shown in FIG. 5C. Consequently, the feed holes 208' of the subsequent carrier tape 200' engage with the teeth 14a of the sprocket wheel 14. On the other hand, the feed holes 208 of the preceding carrier tape 200 below the subsequent carrier tape 200' are released from the teeth 14a of the sprocket wheel 14.

The automatic feeding device 50, as shown in FIG. 1, is configured to automatically feed the subsequent carrier tape 200' in the tape feeding direction A by rotating the sprocket wheel 14, when a tape end detection sensor 80, which located on the tape path P1 between automatic feeding device 50 and the top tape removing device 20, detects the rear end (rear end face) in the tape feeding direction A of the preceding carrier tape 200.

The automatic feeding device 50 is configured to keep the subsequent carrier tape 200' waiting by use of the swing lever 54 so as to prevent the subsequent carrier tape 200' from moving in the tape feeding direction A before the tape end detection sensor 80 detects the rear end in the tape feeding direction A of the preceding carrier tape 200. That is, the automatic feeding device 50 is configured to prevent the subsequent carrier tape 200' from moving in the tape feeding direction A with it riding on the preceding carrier tape 200.

By the swing lever 54, the subsequent carrier tape 200' is kept waiting with it stacking on the preceding carrier tape 200 at between the guide surface 12f of the body part 12 and the guide surface 52a of the biasing block 52. The swing lever 54, as shown in FIG. 5C, is supported by a rotation shaft 60 extending in X-axis direction and freely swings about the rotation shaft 60. The swing lever 54 also is swingable about the rotation shaft 60 and has a free end 54a facing to the guide surface 52a of the biasing block 52. The free end 54a of the swing lever 54 contacts with the front end 212' in the tape feeding direction A of the subsequent carrier tape 200' and thereby keep the subsequent carrier tape 200' waiting.

The swing lever 54 is driven by the drive bar 56 extending in X-axis direction and thus the free end 54a thereof rotates about the rotation shaft 60. Consequently, the free end 54a comes close to or gets away from the guide surface 52a of the biasing block 52. Both ends in X-axis direction of the drive bar 56 are supported by support members 62 mounted on the elevating block 58 movable in Z-axis direction. The drive bar 56 is provided on the elevating block 58 through the support members 62 so that the carrier tape 200 can pass through between the drive bar 56 and the elevating block 58.

The elevating block 58 is provided in the body part 12 with it being movable in Z-axis direction and has a guide surface 58a contacting with the back surface 200b of the carrier tape 200. The elevating block 58 also is biased toward the swing lever 54 by a spring 64. The elevating block 58 further engages with and thus operates simultaneously with the biasing block 52 so that the guide surface 58a of the elevating block 58 and the guide surface 52a of the biasing block 52 are maintained at same level (Z-axis position).

The biasing block 52, the swing lever 54, the drive bar 56, the elevating block 58, the spring 60, the support members 62, and the spring 64, which are elements of the automatic feeding device 50, are configured to be able to carry out the following operations.

As shown in FIG. 5B, each element of the automatic feeding device 50 is configured such that, when there is one carrier tape 200 in the tape thickness direction between the guide surface 12f of the body part 12 and the guide surface 52a of the biasing block 52, a distance in Z-axis direction from the guide surface 52a of the biasing block 52 to the free end 54a of the swing lever 54 is larger than thickness of one carrier tape 200. Consequently, one carrier tape 200, which is between the guide surface 12f of the body part 12 and the guide 52a of the biasing block 52, can pass through in the tape feeding direction A between the free end 54a of the swing lever 54 and the guide surface 52a of the biasing block 52.

On the other hand, as shown in FIG. 5C, each element of the automatic feeding device 50 is configured such that, when the preceding carrier tape 200 and the subsequent carrier tape 200' are overlapped in the tape thickness direction (Z-axis direction) between the guide surface 12f of the body part 12 and the guide surface 52a of the biasing block 52, the distance in Z-axis direction from the guide surface 52a of the biasing block 52 to the free end 54a of the swing lever 54 is larger than thickness of the preceding carrier tape 200 and is smaller than sum of thicknesses of the preceding carrier tape 200 and the subsequent carrier tape 200'. Consequently, the preceding carrier tape 200 on the guide surface 52f of the biasing block 52-side can pass through in the tape feeding direction between the guide surface 52a of the biasing block 52 and the free end 54a of the swing lever 54. In contrast, the subsequent carrier tape 200' on the guide surface 12f of the body part 12-side cannot pass thorough in the tape feeding direction A between the preceding carrier tape 200 and the free end 54a of the swing lever 54 due to the contact of the front end 212' thereof in the tape feeding direction A and the free end 54a of the swing lever 54. Consequently, the swing lever 54 keeps the subsequent carrier tape 200' waiting.

Figure 5D:
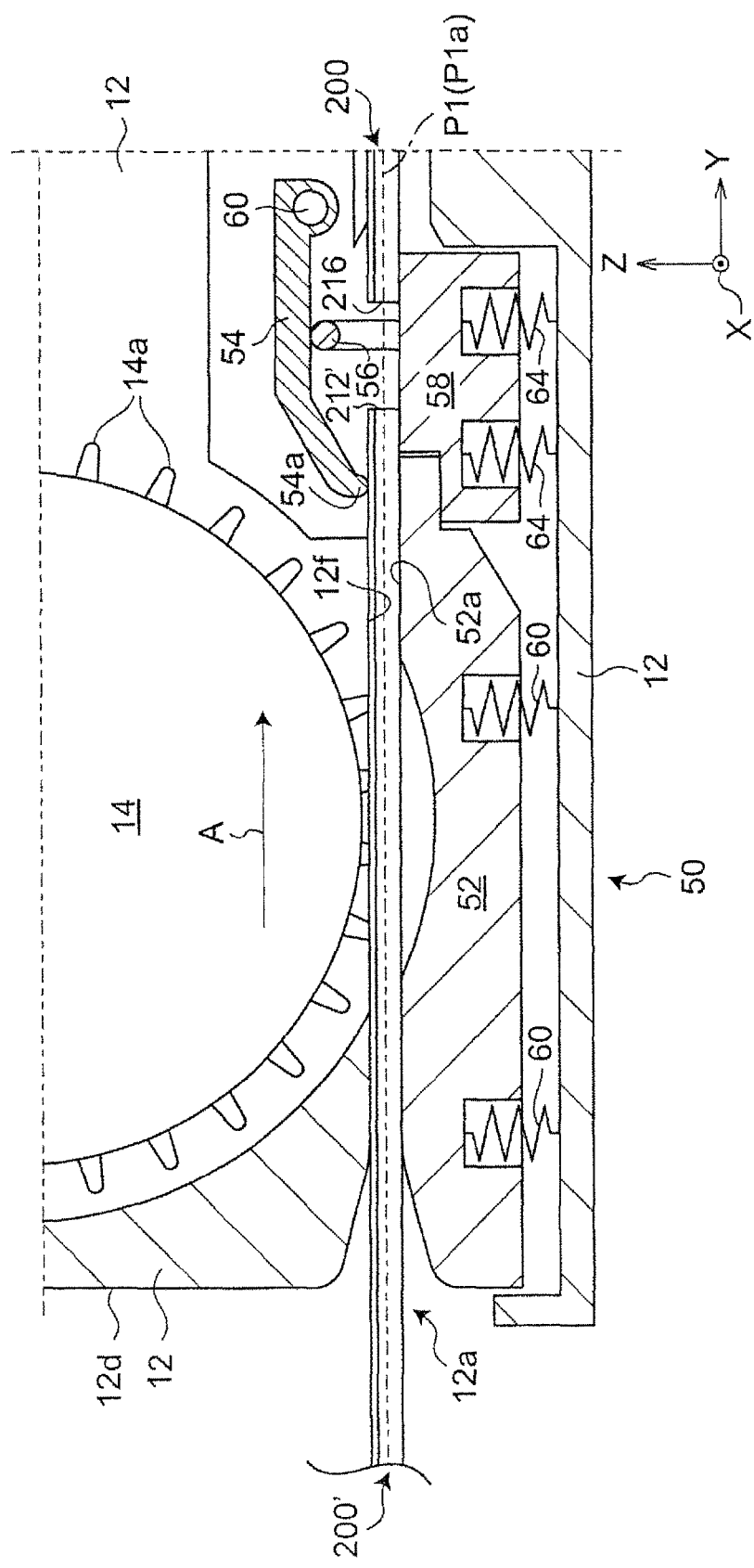
FIG. 5D shows schematically the configuration of the automatic feeding device right after a feeding of the subsequent carrier tape toward the component supply position has been started.

As shown in FIG. 5D, when the rear end 216 (rear face) in the tape feeding direction A of the preceding carrier tape 200 fed in the tape feeding direction A by the sprocket wheels 16, 18 has passed beyond the front end 212' (front face) in the tape feeding direction A of the subsequent carrier tape 200', the biasing block 52 is biased by the spring 60 and thus moves toward the guide surface 12f of the body part 12. Consequently, the subsequent carrier tape 200' is directly held between the guide surface 12f of the body part 12 and the guide surface 52a of the biasing block 52, and thereby generate a gap, through which the subsequent carrier tape 200' can pass, between the guide surface 52a of the biasing block 52 and the free end 54a of the swing lever 54. When the tape end detection sensor 80 has detected the rear end 216 in the tape feeding direction A of the preceding carrier tape 200, the subsequent carrier tape 200' is fed in the tape feeding direction A by the sprocket wheel 14 and then passes through between the guide surface 52a of the biasing block 52 and the free end 54a of the swing lever 54.

Hereinabove, the configuration of the component supplying apparatus 10 in accordance with the embodiment is described. Hereinbelow, the reason that the main tape path P1 and the sub tape path P2 are provided in the component supplying apparatus 10 is described.

Figure 6:
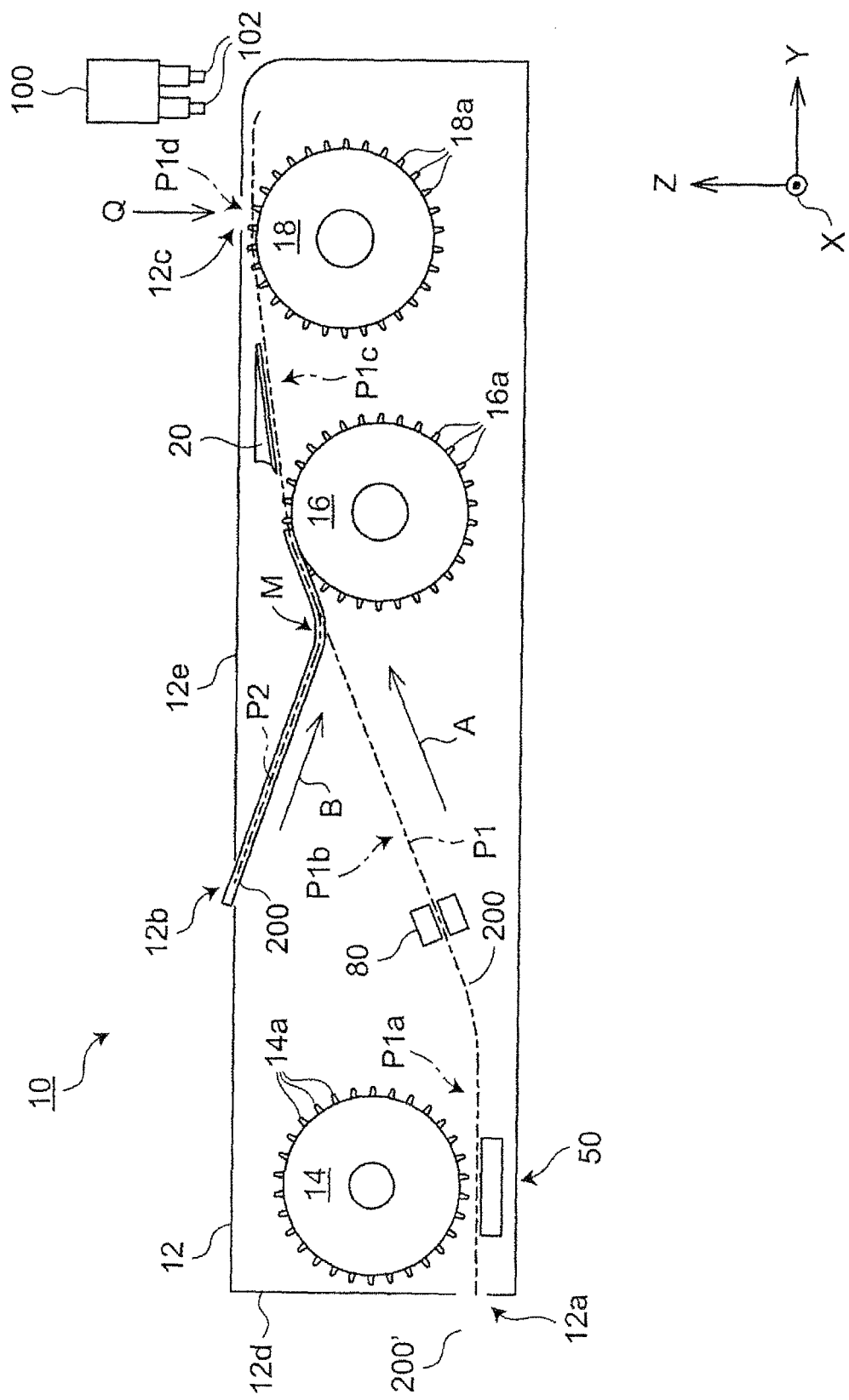
FIG. 6 shows schematically the configuration of the component supply apparatus with the carrier tape having been entered into a sub tape entering port.

As noted above and shown in FIG. 1, the distance in sub tape path P2 (length of the sub tape path P2) from the meeting point M, at which the main tape path P1 and the sub tape path P2 meet each other, to the sub tape entering port 12b is shorter than the distance in the main tape path P1 from the meeting point M to the main tape entering port 12a. Thus, as shown in FIG. 6, by using the sub tape path P2, a carrier tape 200, which has a length shorter than the distance in the main tape path P1 from the main tape entering port 12a to the sprocket wheel 16, can supply the nozzles of the transfer head 100 of the component mounting apparatus with the components.

Specifically, in the embodiment, if the carrier tape 200, which has a length shorter than the distance in the main tape path P1 from the main tape entering port 12a to the sprocket wheel 16, is longer than the distance in the tape path P1 between the sprocket wheel 16 and the sprocket wheel 14 which is located between the meeting point M and the main tape entering port 12a, the carrier tape 200 can be fed from the main tape entering port 12a to the sprocket wheel 16.

That is, in the embodiment, the component supplying apparatus 10 is configured to feed the carrier tape 200 toward the component supply port 12c by three sprocket wheels 14, 16, and 18, as shown in FIG. 1. Additionally, in the main tape path P1, a distance between the main tape entering port 12a and the sprocket wheel 14, a distance between the sprocket wheels 16, 18, and a distance between the sprocket wheel 18 and the component supply port 12c are shorter than the distance between the sprocket wheels 14, 16. For this reason, if the carrier tape 200 have a length longer than the distance in the main tape path P1 between the sprocket wheels 14, 16, the carrier tape 200 can be transmitted from the sprocket wheel 14 to the sprocket wheel 16 and from the sprocket wheel 16 to the sprocket wheel 18. Consequently, such carrier tape 200 can, once entered into the main tape entering port 12a, supply the nozzles 102 of the transfer head 100 of the component supplying apparatus with the components.

In light of this, the distance from the sub tape entering port 12b to the meeting point M at which the main tape path P1 and the sub tape path P2 meet is shorter than distance from the sprocket wheel 14 to the meeting point M as possible, in order to supply the nozzles 102 of the transfer head 100 of the component mounting apparatus with the components by using a carrier tape 200 shorter than the distance in main tape path P1 from the sprocket wheel 14 to the sprocket wheel 16.

By providing the component supplying apparatus 10 with the sub tape path P2, it is possible to use a carrier tape 200 having an unusable length in the component supplying apparatus 10 without the sub tape path P2, that is, has a length shorter than the distance in the main tape path P1 from the sprocket wheel 14 to the sprocket wheel; 16.

By using simple configuration, that is, by providing the component supplying apparatus 10 with the sub tape entering port 12b and the sub tape path P2 extending from the sub tape entering port 12b to the main tape path P1, the component supplying apparatus 10 can use a carrier tape 200 having a length shorter than the distance in the main tape path P1 from the sprocket wheel 14 to the sprocket wheel 16.

In order to use a carrier tape 200 having a length shorter than the distance in the main tape path P1 from the sprocket wheel 14 to the sprocket wheel 16, it is considered that an additional main tape entering port having the automatic feeding device 50 and connected with the main tape path P1, that is, being different from the main tape entering port 12a having the automatic feeding device 50, is added into the body part 12 instead of the sub tape entering port 12b and the sub tape path P2. However, in this case, the component supplying apparatus needs a drive device for rotating a sprocket wheel in the automatic feeding device of the additional main tape entering port different from the main tape entering port 12a in synchronization with the sprockets 14, 16, and 18. In addition to this, the body part needs a space in which the drive device and the sprocket wheel in the automatic feeding device of the additional main tape entering port are disposed. Thereby complexes and sizes up the component supplying apparatus 10. In contrast, in the embodiment, because the simple sub tape path P2 for feeding of the carrier tape 200 is only provided in the body part 12, the component supplying apparatus 10 does not become complex and big.

According to the aforementioned component supplying apparatus 10 operable to use the carrier tape 200 having a length shorter than the distance in the main tape path P1 from the sprocket 14 to the sprocket 16, for example, when a few trial products on which components of the carrier tape 200 are mounted are made by a component mounting apparatus, when operation checks of the component supplying apparatus 10 and a component mounting apparatus are carried out, or when a carrier tape 200 offered by a carrier tape supplier is tested, a relatively short carrier tape 200 having any length can be used instead of, for example, a relatively long carrier tape wound around a reel and having a regular length.

As shown in FIGS. 1 and 6, the sub tape path P2 may extend in an obliquely downward direction from the sub tape entering port 12b and meet with the first slope path P1b of the main tape path P1 extending in an obliquely upward direction from the main tape entering port 12a-side toward the component supply port 12c-side. As shown in FIG. 6, thereby bends the carrier tape 200 having been entered into the sub tape entering port 12b in concave shape toward the top tape 206-side (upward). Because the carrier tape 200 is bent in concave shape toward the top tape 206-side, a gap tends to occur between the center portion in the tape width direction of the top tape 206 and the base tape 204 (compared to the carrier tape 200 is bent in the opposite direction). Due to the gap, the edge tip 22d of removal part 22 of the top tape removing device 20 can easily enter between the top tape 206 and the base tape 204. Consequently, a removability of the top tape removing device 20 for the carrier tape 200 having been entered into the sub tape entering port 12b is improved.

According to the embodiment, it is possible to supply the nozzles 102 of the transfer head 100 of the component mounting apparatus with component from both relatively long carrier tape having a regular length and, for example, wound around a reel and relatively short carrier tape having any length, without sizing up and complexing the component supplying apparatus 10.

Though the invention has been described with reference to the above embodiment, the invention is not limited to the embodiment.

For example, in the above embodiment, the automatic feeding device 50, as shown in FIG. 5C, includes one sprocket wheel 14, the biasing block 52 biasing the preceding and subsequent carrier tapes 200, 200' toward the sprocket wheel 14, and the swing lever 54 keeping the subsequent carrier tape 200' waiting by the contact of the front end 212' of the subsequent carrier tape 200' until the rear end 216 of the preceding carrier tape 200 passes beyond the front end 212' of the subsequent carrier tape 200'. An automatic feeding device stating a feeding of a subsequent carrier tape automatically is not limited to the automatic feeding device 50. An automatic feeding device, in the broad sense, until a rear end in the tape feeding direction of one of two carrier tapes having been entered into the main tape entering port and overlapped each other passes beyond a front end in the tape feeding direction of the other, can keep the other carrier tape waiting in the main tape path between the main tape entering port and the meeting point.

For example, in the above embodiment, the component supplying apparatus 10 is configured to feed the carrier tape 200 in the tape feeding direction A toward the component supply port 12c by using three sprocket wheels 14, 16, and 18. The invention however is not limited thereto.

For example, as shown in FIG. 1, the sprocket wheel 16, which located in the main tape path P1 between the top tape removing device 20 and the meeting point M at which the main tape path P1 and the sub tape path P2 meet, functions to improve the removability of the top tape removing device 20 because the sprocket wheel 16 presses the carrier tape 200, which has been entered in the body part 12 through the main tape entering port 12a or the sub tape entering port 12c, into the blade edge 22b of the removal part 22 of the top tape removing device 20. The sprocket wheel 16 can be omitted if the top tape removing device 20 has a sufficient removability without the sprocket wheel 16.

The sprocket wheel 18 functions not only to feed the carrier tape 200 in the tape feeding direction A but also to align the carrier tape 200 on the component supply position Q in the tape width direction, by engaging with the feed holes 208 adjacent to the recess 202 in which the component is exposed through the component supply port 12c. Thereby enhances an accuracy in component picking of the nozzles 102 of the transfer head 100 of the component mounting apparatus.

Instead of the sprocket wheel 18, for example, a guide member (not shown) contacting with end faces 214a, 214b (See FIG. 2) in the tape width direction of the carrier tape 200 may be used to align the carrier tape 200 on the component supply position Q.

With the sprocket wheels 16, 18 are omitted, a further sprocket wheel may be provided in the main tape path P1 downstream of the component supply position Q in the tape feeding direction A.

A component supplying apparatus, in the broad sense, includes at least one sprocket wheel engaging with a carrier tape having been entered into the body part through the main tape entering port or the sub tape entering port at the main tape path downstream in the tape feeding direction of the meeting point of the main tape path and the sub tape path.

Additionally, the automatic feeding device 50 may be omitted. Instead of including the automatic feeding device 50, for example, the component supplying apparatus 10 may be configured to urge worker to set a new carrier tape 200 on the main tape entering port 12a when the tape end detection sensor 80 detects the rear end in the tape feeding direction of the carrier tape 200.

Also, the sprocket wheel 14, which located on the main tape path P1 between the main tape entering port 12a and the meeting point M of the main tape path P1 and the sub tape path P2, may be omitted. In this case, the length of the sub tape path P2 (the distance from the sub tape entering port 12b to the meeting point M) is shorter than the distance in the main tape path P1 from the main tape entering port 12a to the meeting point M.

Further, in the above embodiment, as shown in FIG. 1, the sub tape entering port 12b is formed on the upper surface 12e (end surface in the vertical direction (Z-axis direction)) of the body part 12. The invention is not limited thereto. For example, the sub tape entering port 12b may be formed on an end surface 12d in the horizontal direction (Y-axis direction) of the body part 12.

Additionally, in the above embodiment, as shown in FIG. 1, the sub tape path P2 extends in the obliquely downward direction from the sub tape entering port 12b and then meets the first slope path portion P1b of the main tape path P1 extending in the obliquely upward direction. The invention is not limited thereto. For example, the main tape path may have a horizontal path portion extending in the horizontal direction at almost center position in Z-axis direction of the body part, and the sub tape path may be extend in the obliquely downward from the sub tape entering port and meet the horizontal path portion of the main tape path.

Furthermore, in the above embodiment, as shown in FIG. 1, the sub tape path P2 extends linearly from the sub tape entering port 12b. The invention is not limited thereto. The sub tape path may be extends in a curved shape.

Although the present invention has been fully described in connection with the preferred embodiments thereof with reference to the accompanying drawings, it is to be noted that various changes and modifications are apparent to those skilled in the art. Such Changes and modifications are to be understood as included within the scope of the present invention as defined by the appended claims unless they depart therefrom.

The contents of a specification, drawings and claims of a Japanese patent application No. 2013-027385 filed on Feb. 15, 2013 are herein expressly incorporated by reference in their entirety.

INDUSTRIAL APPLICABILITY

The invention is applicable to component supplying apparatuses having a tape path extending in a body part from a tape entering port, into which a carrier tape is entered, to the underside of a component supply port, through which nozzles of a transfer head of a component mounting apparatus pick up components from the carrier tape in the body part, and configured to remove a top tape from a base tape of the carrier tape on the tape path in the body part.

The invention claimed is:

1. A component supplying apparatus for feeding in a tape length direction a carrier tape having a base tape having recesses for accommodating components and feed holes arranged thereon in the tape length direction and a top tape pasted on the base tape so as to cover the recesses, the component supplying apparatus comprising:
a body part,
a main tape entering port formed on the body part,
a component supply port which formed on an upper surface of the body part and through which nozzles of a transfer head of a component mounting apparatus pick up the components in the recesses of the carrier tape having been entered in the body part,
a main tape path extending in the body part from the main tape entering port to the underside of the component supply port,
a top tape removing part removing the top tape from the base tape of the carrier tape on the main tape path upstream in the tape feeding direction of the component supply port so as to expose the components in the recesses,
a sub tape entering port formed on the body part and different from the main tape entering port,
a sub tape path extending in the body port from the sub tape entering port and meeting the main tape path at a meeting point in the main tape path located upstream in the tape feeding direction of the top tape removing part, and
at least one first sprocket wheel engaging with the feed holes of the carrier tape on the main tape path downstream in the tape feeding direction of the meeting point and feeding the carrier tape in the tape feeding direction,
wherein the main tape path includes a horizontal path portion passing under the component supply port in a horizontal direction and a slope path portion extending in an obliquely upward direction toward the horizontal path portion,
wherein the sub tape path extends in an obliquely downward direction and meets the slope path portion of the main tape path, and
wherein a length of the sub tape path is shorter than a length of the main tape path from the main tape entering port to the meeting point.

2. The component supplying apparatus according to claim 1, further comprising a second sprocket wheel engaging with the feed holes of the carrier tape on the main tape path between the main tape entering port and the meeting point and feeding the carrier tape in the tape feeding direction,
wherein the length of the sub tape path is shorter than a length of the main tape path from the second sprocket wheel to the meeting point.

3. The component supplying apparatus according to claim 1, wherein the main tape entering port has a size enough for two carrier tape overlapping each other in the thickness direction to enter in,
further comprising an automatic feeding device, until a rear end in the tape feeding direction of one of two carrier tapes having been entered into the main tape entering port and overlapped each other passes beyond a front end in the tape feeding direction of the other, keep the other carrier tape waiting in the main tape path between the main tape entering port and the meeting point.

4. The component supplying apparatus according to claim 1, wherein the first sprocket wheel engages with the feed holes of the carrier tape on the main tape path between the top tape removing part and the meeting point.

5. The component supplying method for feeding in a tape length direction a carrier tape having a base tape having recesses accommodating components and feed holes respectively arranged thereon in the tape length direction and a top tape pasted on the base tape so as to cover the recesses, the component supplying method comprising:
entering the carrier tape into a body part of a component supplying apparatus through a main tape entering port,
feeding the carrier tape having been entered in to the body part in the tape feeding direction along a main tape path which extending in the body part from the main tape entering port to the underside of a component supply port and which including a horizontal path portion passing under the component supply port in a horizontal direction and a slope path portion extending in an obliquely upward direction toward the horizontal path portion,
removing the top tape from the base tape of the carrier tape on the main tape path upstream in the tape feeding direction of the component supply port so as to expose the components in the recesses, and picking up the components in the recesses of the carrier tape with the top tape removed through the component supply port by using nozzles of a transfer head of a component mounting apparatus, further comprising, in case that the carrier tape has a length shorter than the distance in the main tape path from main tape entering port to the component supply port, feeding the shorter carrier tape in the tape feeding direction toward the component supply port along a sub tape path which extends in the body part in an obliquely downward direction from a sub tape entering port different from the main tape entering port and which meets the main tape path at a meeting point on the slope path portion of the main tape path located upstream in the tape feeding direction of the top tape removing part, by using at least one sprocket wheel engaging with the feed holes of the carrier tape on the main tape path downstream in the tape feeding direction of the meeting point, wherein a length of the sub tape path from the sub tape entering port to the meeting point is shorter than a length of the main tape path from the main tape entering port to the meeting point.

* * * * *